United States Patent
Le et al.

(10) Patent No.: US 6,467,858 B1
(45) Date of Patent: Oct. 22, 2002

(54) COMPUTER COMPONENT RETENTION TRAY

(75) Inventors: Bao G. Le, Orange; Derek T. Nguyen, Foothill Ranch; Lisa Luong, Trabuco Canyon, all of CA (US)

(73) Assignee: Gateway, Inc., N. Sioux City, SD (US)

( * ) Notice: Subject to any disclaimer, the term of this patent is extended or adjusted under 35 U.S.C. 154(b) by 0 days.

(21) Appl. No.: 09/471,737

(22) Filed: Dec. 23, 1999

(51) Int. Cl.[7] ............................................. A47B 81/00
(52) U.S. Cl. .................................. 312/223.2; 312/333
(58) Field of Search ......................... 312/223.1, 223.2, 312/205, 330.1, 332.1, 333; 361/683, 724, 725, 726, 727, 740; 211/88.02, 175, 26; 206/557, 560, 8; 220/8; 248/918, 274.1

(56) References Cited

U.S. PATENT DOCUMENTS

| | | |
|---|---|---|
| 5,003,431 A | 3/1991 | Imsdahl |
| 5,098,175 A | 3/1992 | Cooke et al. |
| 5,142,447 A | 8/1992 | Cooke et al. |
| 5,216,582 A | 6/1993 | Russell et al. |
| 5,253,129 A | 10/1993 | Blackborow et al. |
| 5,262,923 A * | 11/1993 | Batta et al. .............. 312/333 X |
| 5,299,944 A | 4/1994 | Larabel et al. |
| 5,325,263 A | 6/1994 | Singer et al. |
| 5,333,097 A | 7/1994 | Christensen et al. |
| 5,340,340 A | 8/1994 | Hastings et al. |
| 5,502,604 A | 3/1996 | Furay |
| 5,510,955 A | 4/1996 | Taesang |
| 5,524,104 A | 6/1996 | Iwata et al. |
| 5,564,804 A | 10/1996 | Gonzalez et al. |
| 5,566,383 A | 10/1996 | Gildea et al. |
| 5,587,856 A | 12/1996 | Aoyama |
| 5,588,728 A | 12/1996 | Eldridge et al. |
| 5,652,695 A | 7/1997 | Schmitt |
| 5,673,171 A | 9/1997 | Varghese et al. |
| 5,680,293 A | 10/1997 | McAnally et al. |
| 5,682,291 A * | 10/1997 | Jeffries et al. ....... 312/223.2 X |
| 5,726,922 A | 3/1998 | Womble et al. |
| 5,734,557 A | 3/1998 | McAnally et al. |
| 5,751,551 A | 5/1998 | Hileman et al. |
| 5,767,445 A | 6/1998 | Wu |
| 5,805,420 A | 9/1998 | Burke |
| 5,806,949 A * | 9/1998 | Johnson ............... 312/223.2 X |
| 5,808,864 A | 9/1998 | Jung |
| 5,828,547 A | 10/1998 | Francovich et al. |
| 5,886,869 A | 3/1999 | Fussell et al. |
| 5,980,003 A * | 11/1999 | Huang ..................... 312/223.2 |
| 6,075,694 A * | 6/2000 | Mills et al. .......... 312/223.2 X |
| 6,099,098 A * | 8/2000 | Leong ................. 312/223.2 X |
| 6,102,499 A * | 8/2000 | Chen et al. .............. 312/223.2 |
| 6,128,183 A * | 10/2000 | Uchiyama et al. .... 312/223.2 X |
| 6,179,261 B1 * | 1/2001 | Lin ......................... 248/918 X |

* cited by examiner

Primary Examiner—Peter M. Cuomo
Assistant Examiner—Hanh V. Tran

(57) ABSTRACT

A spring-loaded disk drive retention tray comprises a first and a second plate moveably engaged to each other. The plates are kept in a closed position relative to each other via tension from a spring. A hard disk drive housing can be inserted into a first edge of the tray, and pressure to insert a second edge results in the opening of the first and second plate relative to each other such that the disk drive housing can be fully inserted into the retention tray. Once fully inserted, the two plates return to their closed position, and posts integral to the retention tray mechanically lock the hard disk drive housing to the retention tray via insertion of the posts into screw holes located on the hard disk drive housing. The disk drive assembly comprising the disk drive housing and the retention tray can then be inserted into receiving rails in a computer system chassis, and locked into place via mechanical abutments. The disk drive assembly can be removed from the computer system chassis be manually overriding the mechanical abutments, and the disk drive housing can be removed from the retention tray by manually separating the two plates into the open position. All of the above-described steps can be accomplished without the use of tools or screws.

28 Claims, 4 Drawing Sheets

COMPUTER COMPONENT RETENTION TRAY

FIELD OF THE INVENTION

This invention relates to information handling systems such as computer systems, and more specifically to spring-loaded retention trays for installing computer components (such as disk drives) into, or removing them from, a computer system chassis.

BACKGROUND OF THE INVENTION

A common method of assembling a computer system having a hard disk drive comprises the steps of placing a bracket around a hard disk drive housing, and screwing the bracket onto the housing by placing screws through the bracket and into corresponding screw holes in the housing. The bracketed hard disk drive assembly is then screwed into receiving rails that are internally attached to a computer system chassis. It is understood that the actual platters of a typical hard disk are stored along with the drive mechanism within a hard disk drive housing.

However, the use of multiple screws during the assembly process has proved to be time consuming. In addition, as end-users increasingly upgrade their own hard disk drives by removing the originally installed hard disk drive and installing a larger hard disk drive, it has become readily apparent that the use of multiple screws is cumbersome and inconvenient. Thus, many alternative approaches have been developed for installing a hard disk drive into, or removing it from, a computer system chassis, wherein such approach minimizes or eliminates the use of screws. It is understood that many of these approaches, as well as the present invention, could also be utilized for the installation or removal of computer components other than hard disk drives, including floppy disk drives, CD recorder/players, back-up tape drives, DVD recorder/players, etc.

Various different approaches have provided various different advantages. Accordingly, a novel approach for installing a hard disk drive into, or removing it from, a computer system chassis having its own set of advantages is desirable and useful.

SUMMARY OF THE INVENTION

The spring-loaded disk drive retention tray of the present invention provides an apparatus and a simplified method for installing a hard disk drive into, or removing it from, a computer system chassis without the use of any tools or screws. The retention tray comprises a first plate and a second plate movably engaged to each other. A hard disk drive in a housing can be click-locked into the retention tray by aligning a first edge of the housing with a first edge of the retention tray, and then pressing a second edge of the housing into engagement with a second edge of the retention tray. By pressing the second edge of the housing into engagement, the first and second plates move apart relative to each other (open position), such that the hard disk drive housing can be fully inserted into the retention tray, and then locked into place when the first and second plate move back together (closed position). The first and second plate are preferably kept in a closed position via a spring. It is understood that any flexible means of keeping the first and second plate in a closed position could be implemented into the present invention. For example, the first and second plates could be kept in a closed position through the use of rubber bands, or similarly flexible materials. Upon insertion of the hard disk drive housing, or upon manual opening of the first and second plates, the spring, rubber bands, or similar flexible materials would flex enough to allow for the insertion or removal of the hard disk drive housing.

The disk drive assembly, comprising the disk drive housing and retention tray, can then be inserted into a corresponding set of receiving rails positioned inside a computer system chassis. In a preferred embodiment, a common click-lock approach is used wherein the disk drive assembly is inserted into the receiving rails. A first and a second release lever comprises an abutment that forces the first and second release lever together during insertion, and then the first and second release levers pop back to their initial positions when the abutment clears a corresponding edge and locks into place.

By pressing the first and second release lever together, such that the abutments clear the corresponding edges, the disk drive assembly can be removed from the receiving rails. Then, by manually separating the first and second plates, the hard disk drive housing can be easily removed from the retention tray. The above-described process for installation and removal can be accomplished without the use of tools or screws.

Accordingly, it is an object of the present invention to provide an apparatus that enables a user to install a disk drive into, or remove it from, a retaining tray without the use of any tools or screws.

Yet another object of the present invention is to provide an apparatus that enables a user to install a disk drive assembly into, or remove it from, a computer system chassis without the use of any tools or screws.

Another object of the present invention is to provide an apparatus that simplifies the task of installing a disk drive into, or removing it from, a retaining tray by reducing the time it takes to accomplish the task.

It is a further object of the present invention to provide an apparatus that simplifies the task of installing a disk drive assembly into, or removing it from, a computer system chassis by reducing the time it takes to accomplish the task.

Yet another object of the present invention is to provide a method of installing a disk drive into, or removing it from, a retaining tray without the use of tools or screws.

An additional object of the present invention is to provide a method of installing a disk drive assembly into, or removing it from, a computer system chassis without the use of tools or screws.

Further objects and advantages of the present invention will become apparent from a consideration of the drawings and ensuing description.

DETAILED DESCRIPTION OF A PREFERRED EMBODIMENT

Figure 1:
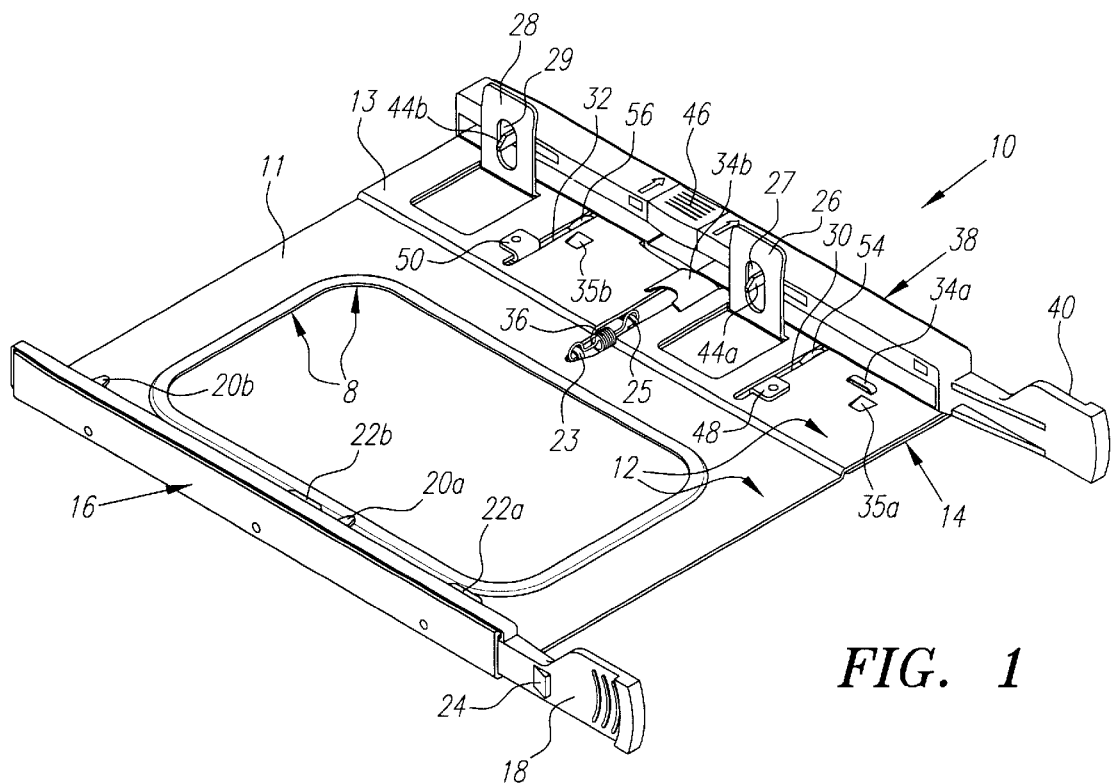
FIG. 1 is a top perspective view of the spring-loaded disk drive retention tray of the present invention.

FIG. 1 is a top perspective view of a spring-loaded disk drive retention tray 10 of the present invention. The retention tray 10 comprises a first plate 12 and a second plate 14. The first plate 12 comprises a first portion 11 and a second portion 13. The first portion 11 of the first plate 12 defines a plate opening 8, and comprises a first edge 16, a first release lever 18, a first set of screw hole posts 20a and 20b, a first set of boosters 22a and 22b, and a first spring engagement 23. The first release lever 18 further comprises a first abutment 24. The second portion 13 of the first plate 12 comprises a first receiving guide 26 defining a first opening 27 and a second receiving guide 28 defining a second opening 29, a first guiding slot 30, a second guiding slot 32, a second set of boosters 34a and 34b, and a spring 36. As better shown in FIG. 2, the second portion 13 further comprises a set of open position stops 35a and 35b.

Figure 2:
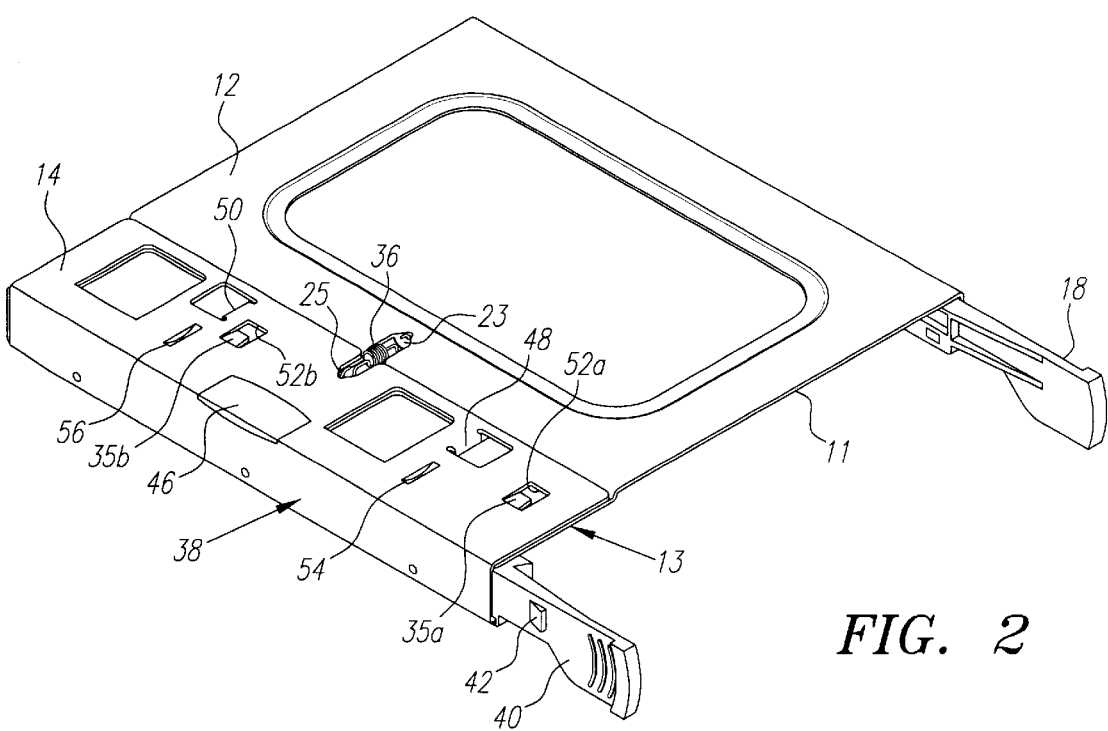
FIG. 2 is a bottom perspective view of the retention tray of the present invention.

As shown in FIG. 2, in conjunction with FIG. 1, the second plate 14 of the retention tray 10 comprises a second spring engagement 25, a second edge 38, a second release lever 40 having a second abutment 42, a second set of screw hole posts 44a and 44b having angled top edges, a manual opening grip 46, a first guiding rail 48, a second guiding rail 50, a third guiding rail 54, a fourth guiding rail 56, and a set of open position stop edges 52a and 52b.

Figure 3:
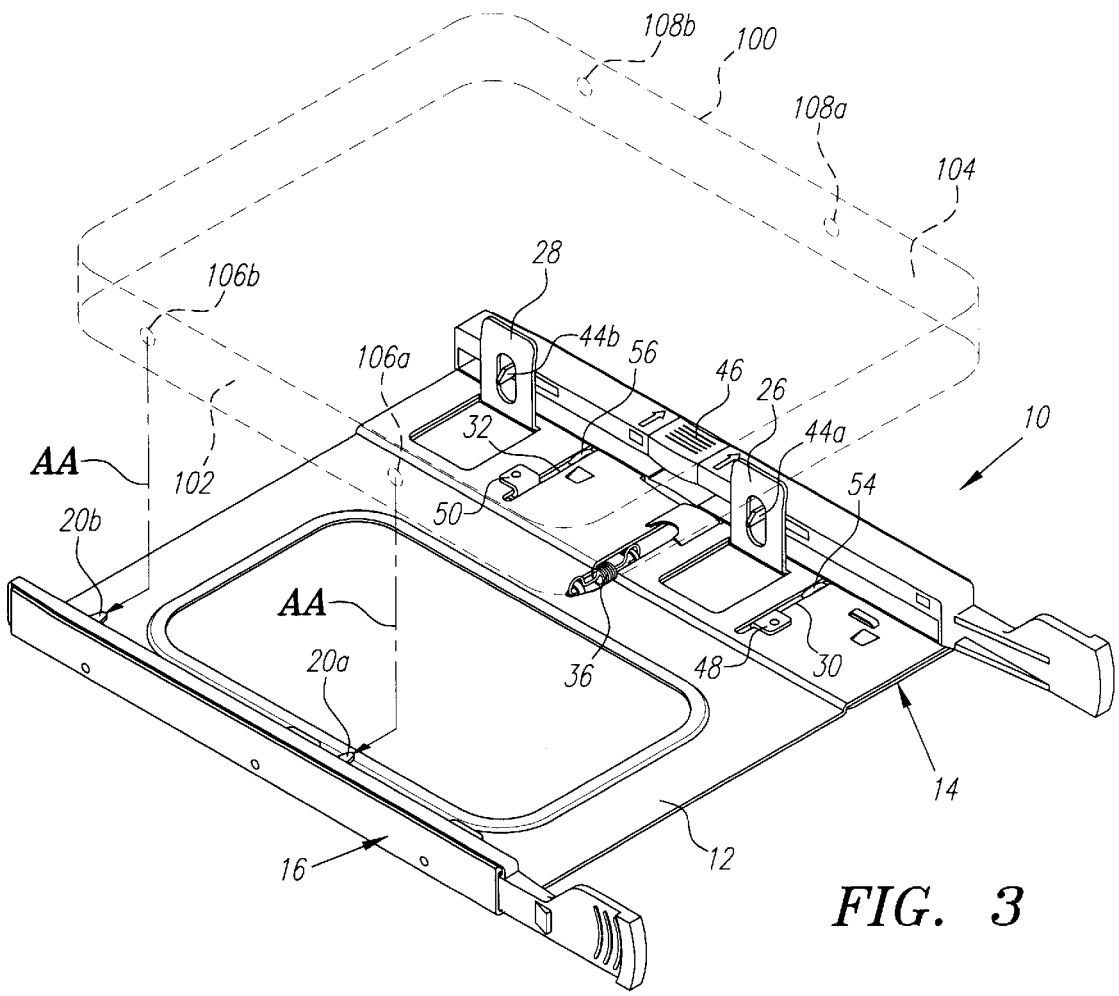
FIG. 3 is a perspective view of the retention tray and a hard disk drive housing shown in phantom being placed into position for insertion into the retention tray.

FIG. 3 is a perspective view of the retention tray 10 and a hard disk drive housing 100 shown in phantom being placed into position for insertion into the retention tray 10. A typical hard disk drive housing has a first edge 102 and a second edge 104. The first edge 102 comprises a first set of screw holes 106a and 106b, and the second edge 104 comprises a second set of screw holes 108a and 108b.

The steps for inserting the hard disk drive housing 100 into the retention tray 10 without the use of tools or screws is as follows. First, a user aligns the first edge 102 of the hard disk drive housing 100 with the first edge 16 of the retention tray by inserting the first set of screw hole posts 20a and 20b into the first set of screw holes 106a and 106b respectively (as shown by arrows AA), while keeping the second edge 104 of the hard disk drive housing 100 above the first and second receiving guides, 26 and 28, respectively. Then, by pressing down on the second edge 104 of the hard disk drive housing 100, the housing 100 will slide down the receiving guides 26 and 28. When the second edge 104 hits the angled top edge of the second set of screw hole posts 44a and 44b, the shape of the posts 44a and 44b in combination with the downward force being exerted by the second edge 104, will cause the second plate 14 to slide into an open position relative to the first plate 12. The first, second, third and fourth guiding rails, 48, 50, 54 and 56, respectively, of the second plate 14 keep the second plate 14 in proper alignment with the first plate 12 by allowing the guiding rails, 48, 50, 54 and 56, of the second plate 14 to slide inside a first and second guiding slot, 30 and 32, respectively of the first plate 12. Once the hard disk drive housing 100 has been fully inserted into the retention tray 10, the second set of screw holes 108a and 108b will be aligned with the second set of screw hole posts 44a and 44b, respectively. Once in this position, the second set of screw hole posts 44a and 44b will slide into the second set of screw holes 108a and 108b, respectively, as a result of the second plate 14 returning to a closed position relative to the first plate 12 via the tension provided by the spring 36.

When the disk drive housing 100 is fully and properly inserted into the retention tray 10, the disk drive housing 100 makes contact with the retention tray 10 at the first set of boosters 22a and 22b, and at the second set of boosters 34a and 34b, as well as at the first and second set of screw hole posts 20a, 20b, 44a and 44b. In a preferred embodiment, at least one of the boosters, 22a, 22b, 34a, or 34b, is made of a conductive material, and is in electrical communication with at least one of the first edge 16 or second edge 38. In this manner, the disk drive housing 100 is capable of being grounded to the computer system chassis 300 (as shown in FIG. 7) via a first or second corresponding receiving rail, 200 and 204 (as shown in FIG. 7), and then through the edge, 16 or 38, and then to the booster, 22a, 22b, 34a, or 34b, and finally to the disk drive housing 100.

Figure 4:
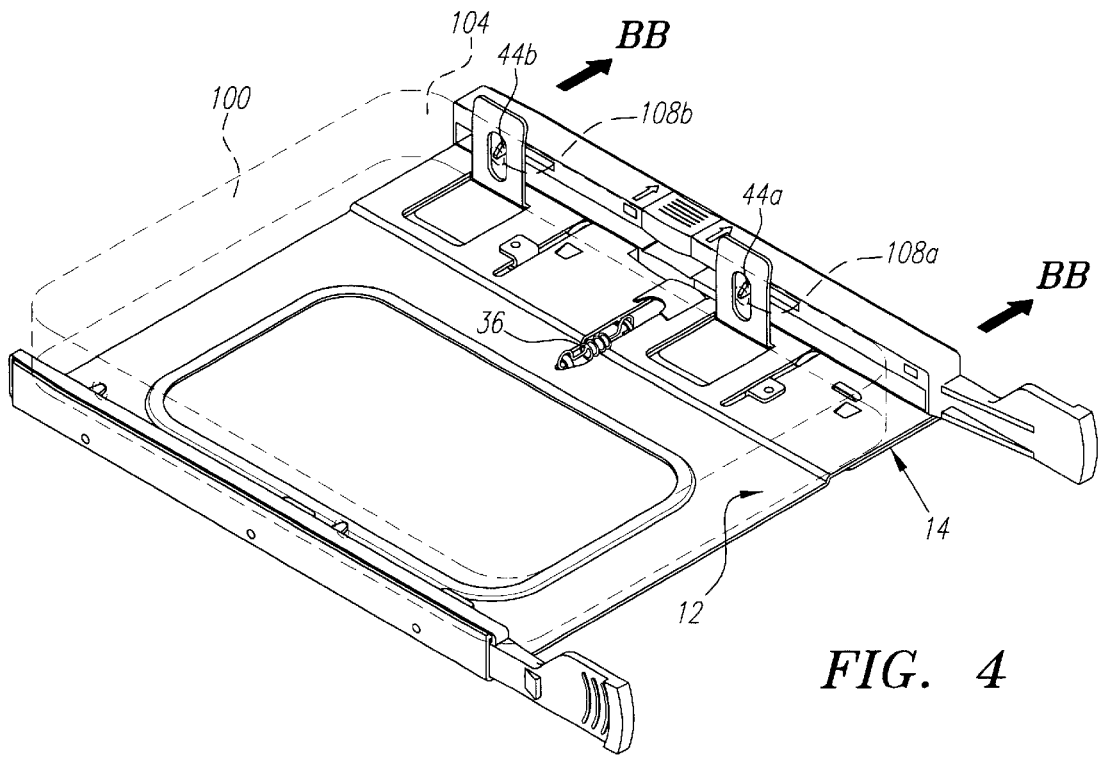
FIG. 4 is a perspective view of the retention tray in which the hard disk drive housing shown in phantom is in the fully inserted position.

In order to remove the hard disk drive housing 100 from the retention tray 10 without the use of tools or screws, a user simply holds the first plate 12 and hard disk drive housing 100 in one hand, and then using the other hand, grips the manual opening grip 46 with the other hand, and manually pulls the second plate 14 away from the first plate 12 (as shown by arrows BB). In order to prevent the first plate 12 from being pulled too far apart from the second plate 14, the plates 12 and 14 can be pulled apart only until the open position stop edges 52a and 52b of the second plate 14 come into contact with the open position stops 35a and 34b of the first plate 12. This action of separating the first and second plates 12 and 14 into an open position withdraws the second set of screw hole posts 44a and 44b from the second set of screw holes 108a and 108b, thereby allowing for the second edge 104 of the hard disk drive housing 100 to be removed from the retention tray 10. This can be accomplished by pushing on the bottom of the housing 100 through the plate opening 8 of the first plate 12. This position is shown in FIG. 4, wherein the spring 36 is in an extended position, and the second set of screw hole posts 44a and 44b have been withdrawn beyond the second edge 104 of the housing 100 and beyond the surface the receiving guides 26 and 28 adjacent to the second edge 14. Once the second edge 104 is lifted out from the retention tray 10, the first edge 102 and the corresponding first set of screw holes 106a and 106b can be pulled away from the first edge 16 and the first set of screw hole posts 20a and 20b.

Figure 5:
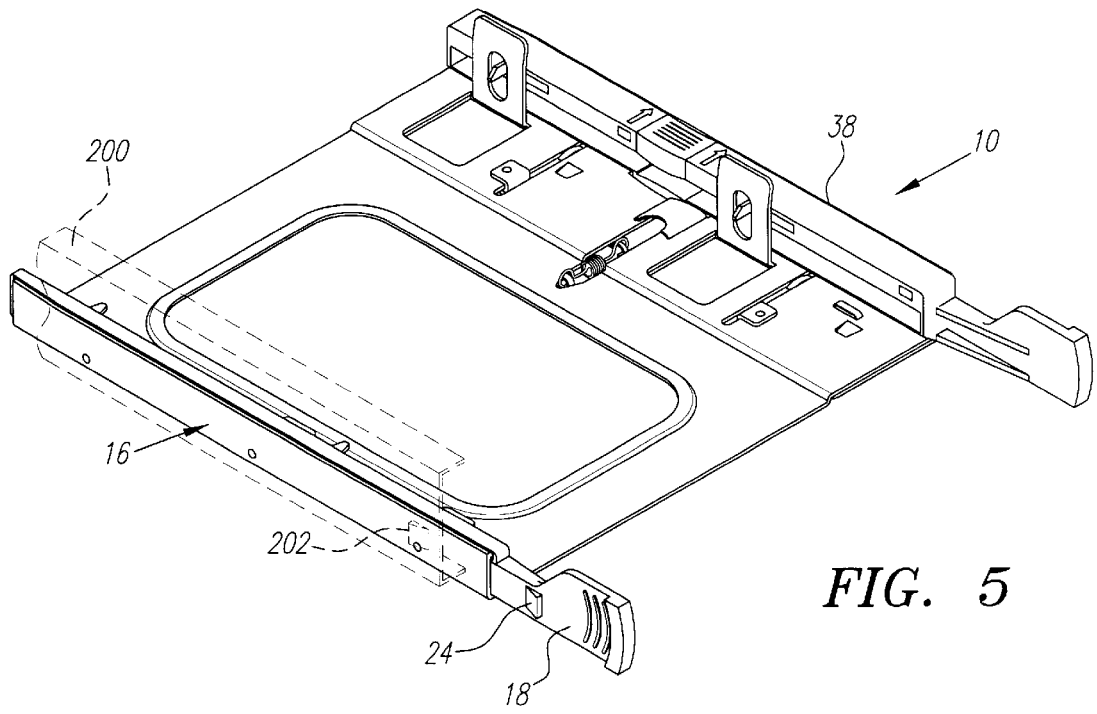
FIG. 5 is a perspective view of the retention tray showing a first corresponding receiving rail in phantom during insertion of the disk drive assembly into the receiving rails.

FIG. 5 is a perspective view of the retention tray 10 partially showing a first corresponding receiving rail 200 having a first corresponding edge 202 (shown in phantom) with the disk drive assembly (for clarity in the drawings, the hard disk drive housing 100 is not shown as a part of the "disk drive assembly" which comprises the housing 100 and the retention tray 10) partially inserted into the first corresponding receiving rail 200. It is understood that both the first edge 16 and second edge 38 of the retention tray 10 would engage a first corresponding receiving rail 200 and a second corresponding receiving rail 204 (as shown in FIG. 7), and that the description of the interaction between one edge of the retention tray 10 and a corresponding receiving rail would be equally applicable to the other edge. For purposes of the following description, only the interaction between the first edge 16 and the first corresponding receiving rail 200 will be discussed.

Figure 6:
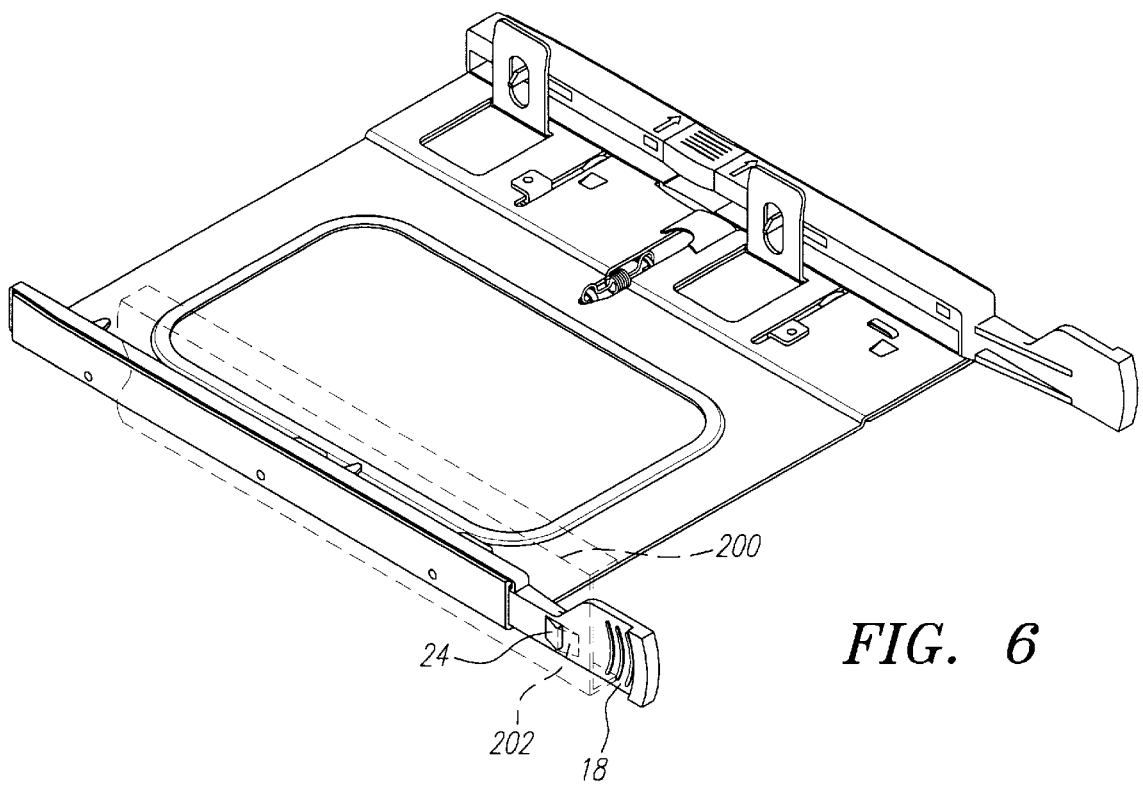
FIG. 6 is a perspective view of the retention tray showing the first corresponding receiving rail in phantom once the disk drive assembly is fully inserted and locked into the receiving rails.
Figure 7:
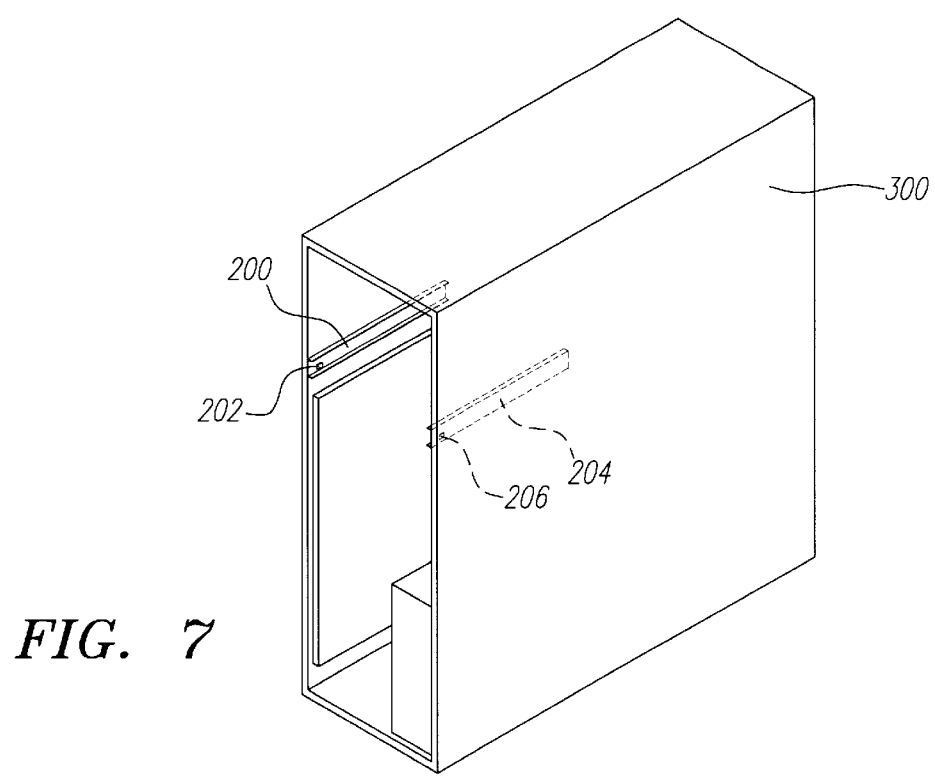
FIG. 7 is a perspective view of a typical computer system chassis with its front plate removed, showing a plurality of receiving rails for receiving a disk drive assembly.

In a preferred embodiment, a computer system chassis 300 (as shown in FIG. 7) comprises at least one space for receiving a hard disk drive assembly comprising a first corresponding receiving rail 200 and a second corresponding receiving rail 204. Once the hard disk drive housing 100 is fully and properly inserted into the retention tray 10, the disk drive assembly comprising the retention tray 10 and the disk drive housing 100 (housing 100 not shown in FIG. 5) is inserted into a space for receiving a hard disk drive assembly by aligning the first edge 16 of the retention tray 10 with the first corresponding receiving rail 200, and by aligning the second edge 38 with the second corresponding receiving rail 204. When the disk drive assembly is almost fully inserted, the first corresponding edge 202 of the first corresponding receiving rail 200 will flexibly force the first release lever 18 away from the first corresponding receiving rail 200, due to the contact with the first abutment 24 on the first release lever 18. However, once the disk drive assembly is fully inserted, as shown in FIG. 6, the first abutment 24 will clear the obstruction created by the first corresponding edge 202, and will allow for the first release lever 18 to return to its pre-flexed position. When the first release lever 18 returns to its pre-flexed position, the first abutment 24 engages the first corresponding edge 202, thereby created a mechanical lock. In other words, with the understanding that the same thing has taken place on the other edge, the disk drive assembly is now firmly locked in the receiving rails. Furthermore, since the receiving rails 200 and 204 are spaced apart to precisely receive the width of the disk drive assembly, once the retention tray 10 is inserted into the receiving rails 200 and 204, it is very difficult, if not impossible, for the first plate 12 and the second plate 14 to separate into the open position. Thus, the disk drive housing 100 is securely positioned inside the retention tray 10 and the retention tray 10 is securely positioned inside the receiving rails 200 and 204.

By pressing the first release lever 18 and second release lever 40 together, such that the first abutment 24 and second abutment 42 clear the first corresponding edge 202 and second corresponding edge 206 (as shown in FIG. 7), respectively, the disk drive assembly can be removed from the receiving rails 200 and 204.

FIG. 7 is a perspective view of a typical computer system chassis 300 with its front plate removed, showing at least one space for receiving a disk drive assembly. The receiving space comprises the first corresponding receiving rail 200 and the second corresponding receiving rail 204 for receiving the disk drive assembly comprising the disk drive housing 100 and the retention tray 10, as discussed above.

It is understood that hard disk drives, as well as other similar computer components, typically require cable connections between the device and the computer system's motherboard, or other input/output connector. In order to more clearly illustrate the present invention, such cables were not discussed or shown in the figures. However, a person of ordinary skill in the art appreciates the need for such cables, and the manner in which such cables would be utilized.

While the above description contains many specificities, these should not be construed as limitations on the scope of the invention, but rather as an exemplification of preferred embodiments thereof. Many other variations are possible. For example, it is to be understood that the spring could be replaced by various structures that provide for similar flexible movement between the first plate 12 and the second plate 14. Furthermore, it is understood that the present invention provides an apparatus for simplifying the insertion and removal of computer components, and is not meant to be limited to use only with a hard disk drive.

What is claimed is:

1. A retention tray comprising:

a first plate having a first edge, a second plate having a second edge,
    said first plate and said second plate being moveably engaged,
    said first edge comprising a first post means for engaging a first corresponding recess in a first edge of a computer component housing,
    said second edge comprising a second post means for engaging a second corresponding recess in a second edge of the computer component housing,
    said first plate and said second plate capable of being moveably engaged into an open position at least in part by exertion of an insertion force on said second post via the second edge of the computer component housing during insertion of the computer component housing into said retention tray, and
    said first plate and said second plate capable of being moveably engaged into a closed position upon proper insertion of the computer component housing into said retention tray, thereby enabling engagement of said first post into the first corresponding recess and said second post into the second corresponding recess.

2. The retention tray of claim 1, further comprising:

a spring, said spring being connected to said first plate and to said second plate for enabling the relative movement between said first plate and said second plate from the open position to the closed position.

3. The retention tray of claim 1, further comprising:

a flexible connector, said flexible connector being connected to said first plate and to said second plate for enabling the relative movement between said first plate and said second plate from the open position to the closed position.

4. The retention tray of claim 1, wherein said first plate further comprises a first guiding slot, said second plate further comprises a first guiding rail, and said first plate and said second plate being moveably engaged at least in part by said first guiding rail being in moveable communication with said first guiding slot.

5. The retention tray of claim 1, wherein said first plate further comprises a first guiding rail, said second plate further comprises a first guiding slot, and said first plate and said second plate being moveably engaged at least in part by said first guiding rail being in moveable communication with said first guiding slot.

6. The retention tray of claim 1, wherein said first plate further comprises a first open position stop, said second plate further comprises a first open position stop edge, and a maximum predetermined separation between said first plate and said second plate when in the open position is determined when said open position stop makes contact with said open position stop edge.

7. The retention tray of claim 1, wherein said first plate further comprises a first open position stop edge, said second plate further comprises a first open position stop, and a maximum predetermined separation between said first plate and said second plate, when in the open position, is determined when said open position stop makes contact with said open position stop edge.

8. The retention tray of claim 1, wherein
said first plate further comprises a first receiving guide for enabling proper alignment of the computer component housing during insertion.

9. The retention tray of claim 8, wherein
said first plate further comprises a second receiving guide for enabling proper alignment of the computer component housing during insertion.

10. The retention tray of claim 1, wherein
said second plate further comprises a first receiving guide for enabling proper alignment of the computer component housing during insertion.

11. The retention tray of claim 10, wherein
said second plate further comprises a second receiving guide for enabling proper alignment of the computer component housing during insertion.

12. The retention tray of claim 1, wherein
said first edge comprises a third post for engaging a third corresponding recess in the first edge of the computer component housing.

13. The retention tray of claim 12, wherein
said second edge comprises a fourth post for engaging a fourth corresponding recess in the second edge of the computer component housing.

14. The retention tray of claim 4, wherein
said first plate further comprises a second guiding slot,
said second plate further comprises a second guiding rail, and
said first plate and said second plate being moveably engaged at least in part by said second guiding rail being in moveable communication with said second guiding slot.

15. The retention tray of claim 5, wherein
said first plate further comprises a second guiding rail,
said second plate further comprises a second guiding slot, and
said first plate and said second plate being moveably engaged at least in part by said second guiding rail being in moveable communication with said second guiding slot.

16. The retention tray of claim 1, wherein
said second post comprises a vertically downward-angled top edge for enabling a downward insertion force from the second edge of the computer component housing onto said top edge to assist in the relative movement of said second plate away from said first plate into the open position.

17. The retention tray of claim 1, wherein said first plate further comprises a first booster for ensuring that a bottom side of the computer component housing sits flush against said retention tray.

18. The retention tray of claim 17, wherein said booster comprises a conductive material being in electrical communication with said first edge of said first plate.

19. The retention tray of claim 17, wherein said booster comprises a conductive material being in electrical communication with said second edge of said second plate.

20. The retention tray of claim 1, wherein,
said second edge of said second plate further comprises a manual opening grip for facilitating the manual movement of said second plate relative to said first plate into the open position.

21. The retention tray of claim 1, wherein
said first edge further comprises a first release lever having a first abutment, and
said second edge further comprises a second release lever having a second abutment.

22. The retention tray of claim 21, wherein
said first edge, said first release lever, and said first abutment are capable of being inserted into a first corresponding receiving rail having a first corresponding edge for engaging said first abutment and mechanically locking said retention tray in a properly inserted position within the first corresponding receiving rail, wherein the first corresponding receiving rail is positioned internally within a computer system chassis.

23. A retention tray comprising:
a first plate having a first edge,
a second plate having a second edge,
said first plate and said second plate being moveably engaged,
said first edge comprising a first post means for engaging a first corresponding recess in a first edge of a computer component housing,
said second edge comprising a second post means for engaging a second corresponding recess in a second edge of the computer component housing,
said first plate and said second plate capable of being moveably engaged into an open position at least in part by exertion of an insertion force on said second post via the second edge of the computer component housing during insertion of the computer component housing into said retention tray,
said first plate and said second plate capable of being moveably engaged into a closed position upon proper insertion of the computer component housing into said retention tray, thereby enabling engagement of said first post into the first corresponding recess and said second post into the second corresponding recess,
a spring, said spring being connected to said first plate and to said second plate for enabling the relative movement between said first plate and said second plate from the open position to the closed position,
said first plate further comprising a first guiding slot,
said second plate further comprising a first guiding rail,
said first plate and said second plate being moveably engaged at least in part by said first guiding rail being in moveable communication with said first guiding slot,
said first edge further comprising a first release lever having a first abutment, and
said first edge, said first release lever, and said first abutment are capable of being inserted into a first corresponding receiving rail having a first corresponding edge for engaging said first abutment and mechanically locking said retention tray in a properly inserted position within the first corresponding receiving rail, wherein the first corresponding receiving rail is positioned internally within a computer system chassis.

24. A method of making a computer component suitable for insertion into, and removal from, a computer system chassis without the use of tools or screws, comprising the following steps:
taking a computer component housing having a first edge comprising a first recess and a retention tray having a first edge comprising a first post, and aligning the computer component housing with the retention tray such that the first post is inserted into the first recess, and taking the computer component housing having a second edge comprising a second recess and the retention tray having a second edge comprising a second post, and exerting an insertion force on the second post via the second edge of the computer component housing such that the second edge of the retention tray moves away from the first edge of the retention tray into an open position, thereby allowing for proper insertion of the computer component housing into the retention tray and further allowing insertion of the second post into the second recess.

25. The method of claim 24, further comprising the following steps:

taking the retention tray with the computer component housing properly inserted into the retention tray, wherein the first edge of the retention tray further comprises a release lever having a first abutment, and inserting the retention tray and computer component housing assembly into a first corresponding receiving rail having a first corresponding edge, having the first corresponding edge exert pressure against the first abutment during insertion when the first corresponding edge makes contact with the first abutment, such that the first release lever flexes away from the first corresponding receiving rail, and having the first release lever returning to its pre-flexed position upon proper insertion of the assembly into the first corresponding receiving rail when the first abutment clears the first corresponding edge, such that the first abutment and the first corresponding edge engage each other to create a mechanical lock for keeping the retention tray and computer component housing assembly in place within the first corresponding receiving rail.

26. The method of claim 25, further comprising the following steps:

manually flexing the first release lever away from the first corresponding receiving rail until the first abutment clears the first corresponding edge, and manually pulling the retention tray and computer component housing assembly out of the first corresponding receiving rail.

27. The method of claim 26, further comprising the following steps:

manually separating the second edge of the retention tray away from the first edge of the retention tray such that the second post is removed from the second recess, moving the second edge of the computer component housing out of the retention tray, and moving the first edge of the computer component housing away from the first edge of the retention tray such that the first post is removed from the first recess.

28. A method for inserting a computer component into a computer system chassis without the use of tools, comprising the following steps:

taking a computer component housing having a first edge comprising a first recess and a retention tray having a first edge comprising a first post, and aligning the computer component housing with the retention tray such that the first post is inserted into the first recess, taking the computer component housing having a second edge comprising a second recess and the retention tray having a second edge comprising a second post, and exerting an insertion force on the second post via the second edge of the computer component housing such that the second edge of the retention tray moves away from the first edge of the retention tray into an open position, thereby allowing for proper insertion of the computer component housing into the retention tray and further allowing insertion of the second post into the second recess, taking the retention tray with the computer component housing properly inserted into the retention tray, wherein the first edge of the retention tray further comprises a release lever having a first abutment, and inserting the retention tray and computer component housing assembly into a first corresponding receiving rail having a first corresponding edge, having the first corresponding edge exert pressure against the first abutment during insertion when the first corresponding edge makes contact with the first abutment, such that the first release lever flexes away from the first corresponding receiving rail, and having the first release lever returning to its pre-flexed position upon proper insertion of the assembly into the first corresponding receiving rail when the first abutment clears the first corresponding edge, such that the first abutment and the first corresponding edge engage each other to create a mechanical lock for keeping the retention tray and computer component housing assembly in place within the first corresponding receiving rail.

* * * * *